(12) United States Patent
Wei et al.

(10) Patent No.: US 10,396,026 B2
(45) Date of Patent: Aug. 27, 2019

(54) PRECUT METAL LINES

(71) Applicant: GLOBALFOUNDRIES INC., Grand Cayman (KY)

(72) Inventors: Andy Chih-Hung Wei, Queensbury, NY (US); Guillaume Bouche, Albany, NY (US); Mark A. Zaleski, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/990,653

(22) Filed: Jan. 7, 2016

(65) Prior Publication Data

US 2016/0118341 A1 Apr. 28, 2016

Related U.S. Application Data

(62) Division of application No. 14/463,801, filed on Aug. 20, 2014, now Pat. No. 9,263,325.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/32139* (2013.01); *H01L 21/7682* (2013.01);
(Continued)

(58) Field of Classification Search
CPC ........... H01L 21/0274; H01L 21/28556; H01L 21/0214; H01L 21/02642; H01L 21/3212; H01L 21/30617; H01L 21/31683; H01L 21/4763; H01L 29/0649; H01L 51/4226; H01L 21/76877; H01L 21/76829; H01L 21/76802; H01L 21/76831; H01L 23/5226; H01L 21/7682; H01L 21/76816;
(Continued)

(56) References Cited

U.S. PATENT DOCUMENTS

| 6,987,067 | B2 | 1/2006 | Fischer et al. |
| 7,898,007 | B2 | 3/2011 | Lee et al. |
| 8,120,129 | B2 * | 2/2012 | Park ................. H01L 27/14621 257/432 |
| 8,536,695 | B2 | 9/2013 | Liu et al. |

(Continued)

OTHER PUBLICATIONS

Office Action dated Dec. 29, 2017 in Taiwanese Patent Application No. 104122504.

*Primary Examiner* — Marcos D. Pizarro
*Assistant Examiner* — Antonio B Crite
(74) *Attorney, Agent, or Firm* — Williams Morgan, P.C.

(57) ABSTRACT

Embodiments of the present invention provide a method for cuts of sacrificial metal lines in a back end of line structure. Sacrificial Mx+1 lines are formed above metal Mx lines. A line cut lithography stack is deposited and patterned over the sacrificial Mx+1 lines and a cut cavity is formed. The cut cavity is filled with dielectric material. A selective etch process removes the sacrificial Mx+1 lines, preserving the dielectric that fills in the cut cavity. Precut metal lines are then formed by depositing metal where the sacrificial Mx+1 lines were removed. Thus embodiments of the present invention provide precut metal lines, and do not require metal cutting. By avoiding the need for metal cutting, the risks associated with metal cutting are avoided.

14 Claims, 21 Drawing Sheets

(51) Int. Cl.
  *H01L 21/3213* (2006.01)
  *H01L 23/528* (2006.01)
  *H01L 23/532* (2006.01)

(52) U.S. Cl.
  CPC .. *H01L 21/76808* (2013.01); *H01L 21/76816* (2013.01); *H01L 21/76877* (2013.01); *H01L 21/76897* (2013.01); *H01L 23/522* (2013.01); *H01L 23/528* (2013.01); *H01L 23/5222* (2013.01); *H01L 23/53238* (2013.01); *H01L 23/53295* (2013.01); *H01L 2924/0002* (2013.01)

(58) Field of Classification Search
  CPC ......... H01L 21/76808; H01L 21/32139; H01L 21/76897; H01L 21/522; H01L 23/528; H01L 2924/0002; H01L 23/53295; H01L 23/53238; H01L 23/5222
  USPC ............... 257/310, 639, 640, 649, 761, 347, 257/E21.006, E21.007, E21.009, E21.027, 257/E21.17, E21.218, E21.229, E21.237, 257/E21.267, E21.304, E21.319; 438/618
  See application file for complete search history.

(56) References Cited

U.S. PATENT DOCUMENTS

| | | | |
|---|---|---|---|
| 8,779,596 B2 | 7/2014 | Farrar | |
| 9,105,694 B2* | 8/2015 | Lee | H01L 21/76843 |
| 9,123,706 B2* | 9/2015 | Zierath | H01L 21/76877 |
| 9,263,325 B1* | 2/2016 | Wei | H01L 21/76877 |
| 9,368,362 B2* | 6/2016 | Rha | H01L 21/306 |
| 2003/0157794 A1* | 8/2003 | Agarwala | H01L 21/76801 |
| | | | 438/627 |
| 2005/0153505 A1* | 7/2005 | Gambino | H01L 21/76807 |
| | | | 438/233 |
| 2009/0200668 A1* | 8/2009 | Yang | H01L 21/76834 |
| | | | 257/751 |
| 2011/0266682 A1* | 11/2011 | Edelstein | H01L 21/7682 |
| | | | 257/773 |
| 2013/0126816 A1* | 5/2013 | Tang | H01L 27/2463 |
| | | | 257/3 |
| 2015/0021779 A1* | 1/2015 | Liou | H01L 21/76883 |
| | | | 257/773 |
| 2015/0037980 A1* | 2/2015 | Rha | H01L 21/306 |
| | | | 438/700 |
| 2015/0140811 A1* | 5/2015 | Huang | H01L 21/3086 |
| | | | 438/669 |
| 2016/0049364 A1* | 2/2016 | Edelstein | H01L 23/5226 |
| | | | 257/774 |
| 2016/0293547 A1* | 10/2016 | Rha | H01L 21/306 |

* cited by examiner

PRECUT METAL LINES

BACKGROUND OF RELATED APPLICATIONS

This application is a divisional of U.S. patent application Ser. No. 14/463,801, filed Aug. 20, 2014, now U.S. Pat. No. 9,263,325, granted Feb. 16, 2016.

FIELD OF THE INVENTION

The present invention relates generally to semiconductor fabrication, and more particularly, to precut metal lines.

BACKGROUND

As the fabrication techniques for semiconductor devices has progressed, manufacturers have been placing an increasingly larger number of devices on a chip by increasing the integration density of semiconductor devices. Accordingly, a critical dimension (CD) in a design rule is gradually reduced in order to increase the circuit density.

In order to increase the circuit density, it is necessary to reduce the sizes of elements inside the semiconductor devices and reduce the lengths and widths of interconnections which couple the elements together. Moreover, the resistances of interconnections must be small so that electric signals can be transferred with minimal loss within the semiconductor devices through interconnections having narrow widths.

In a typical integrated circuit, there may be many metallization layers and interconnecting via layers formed in a back end of line (BEOL) interconnect structure. The BEOL interconnect structure connects various devices (e.g. transistors, capacitors, etc.) to form functional circuits. During fabrication, it is necessary to form cuts and connections of metal lines to create the desired connectivity to implement a given design. As critical dimensions continue to shrink, this can be challenging. It is therefore desirable to have improvements to address the aforementioned challenges.

SUMMARY

Embodiments of the present invention provide a method for cuts of sacrificial metal lines in a back end of line structure. Sacrificial Mx+1 lines are formed above metal Mx lines. A line cut lithography stack is deposited and patterned over the sacrificial Mx+1 lines and a cut cavity is formed. The cut cavity is filled with dielectric material. A selective etch process removes the sacrificial Mx+1 lines, preserving the dielectric that fills in the cut cavity. Precut metal lines are then formed by depositing metal where the sacrificial Mx+1 lines were removed. Thus, embodiments of the present invention provide precut metal lines, and do not require metal cutting. By avoiding the need for metal cutting, the risks associated with metal cutting are avoided.

In a first aspect, embodiments of the present invention provide a method of forming a semiconductor structure, comprising: forming a plurality of sacrificial Mx+1 lines over a plurality of metal Mx lines; depositing a dielectric layer over the plurality of sacrificial Mx+1 lines; forming a cut cavity in one sacrificial Mx+1 line of the plurality of sacrificial Mx+1 lines; forming a dielectric region in the cut cavity; removing the plurality of sacrificial Mx+1 lines to form a plurality of Mx+1 line cavities; and filling the plurality of Mx+1 line cavities with a metal to form a plurality of metal Mx+1 lines.

In a second aspect, embodiments of the present invention provide a method of forming a semiconductor structure, comprising: forming a plurality of sacrificial Mx+1 lines over a plurality of metal Mx lines; depositing a dielectric layer over the plurality of sacrificial Mx+1 lines; depositing an organic planarization layer on the dielectric layer; depositing a resist layer on the organic planarization layer; forming a cavity in the resist layer and organic planarization layer; removing the resist layer; depositing a conformal spacer layer on the organic planarization layer; performing an anisotropic etch on the conformal spacer layer to form an aperture spacer; forming a cut cavity in one sacrificial Mx+1 line of the plurality of sacrificial Mx+1 lines; forming a dielectric region in the cut cavity; removing the plurality of sacrificial Mx+1 lines to form a plurality of Mx+1 line cavities; and filling the plurality of Mx+1 line cavities with a metal to form a plurality of metal Mx+1 lines.

In a third aspect, embodiments of the present invention provide a method of forming a semiconductor structure, comprising: forming a plurality of sacrificial Mx+1 lines over a plurality of metal Mx lines; depositing a dielectric layer over the plurality of sacrificial Mx+1 lines; forming a cut cavity in one sacrificial Mx+1 line of the plurality of sacrificial Mx+1 lines; forming a dielectric region in the cut cavity; removing the plurality of sacrificial Mx+1 lines to form a plurality of Mx+1 line cavities; depositing a via cut lithography stack; patterning an opening in the via cut lithography stack; forming a via cavity that exposes one Mx metal line of the plurality of metal Mx lines; removing the via cut lithography stack; and filling the plurality of Mx+1 line cavities and via cavity with a metal to form a plurality of metal Mx+1 lines and a via.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
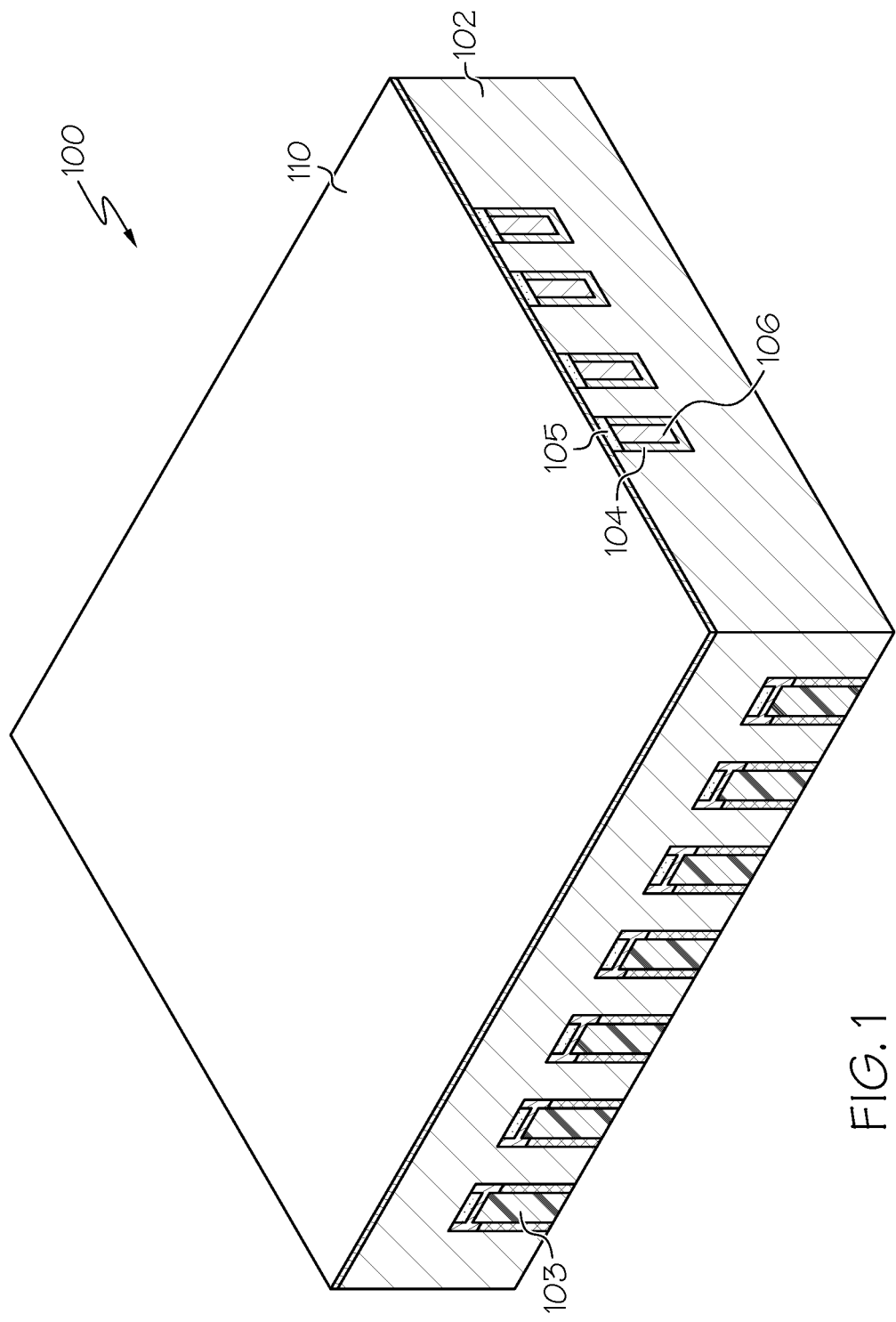

Often, similar elements may be referred to by similar numbers in various figures (FIGs) of the drawing, in which case, typically the last two significant digits may be the same, the most significant digit being the number of the drawing figure (FIG). Furthermore, for clarity, some reference numbers may be omitted in certain drawings.

FIG. 1 is a semiconductor structure at a starting point for embodiments of the present invention.

Figure 2:
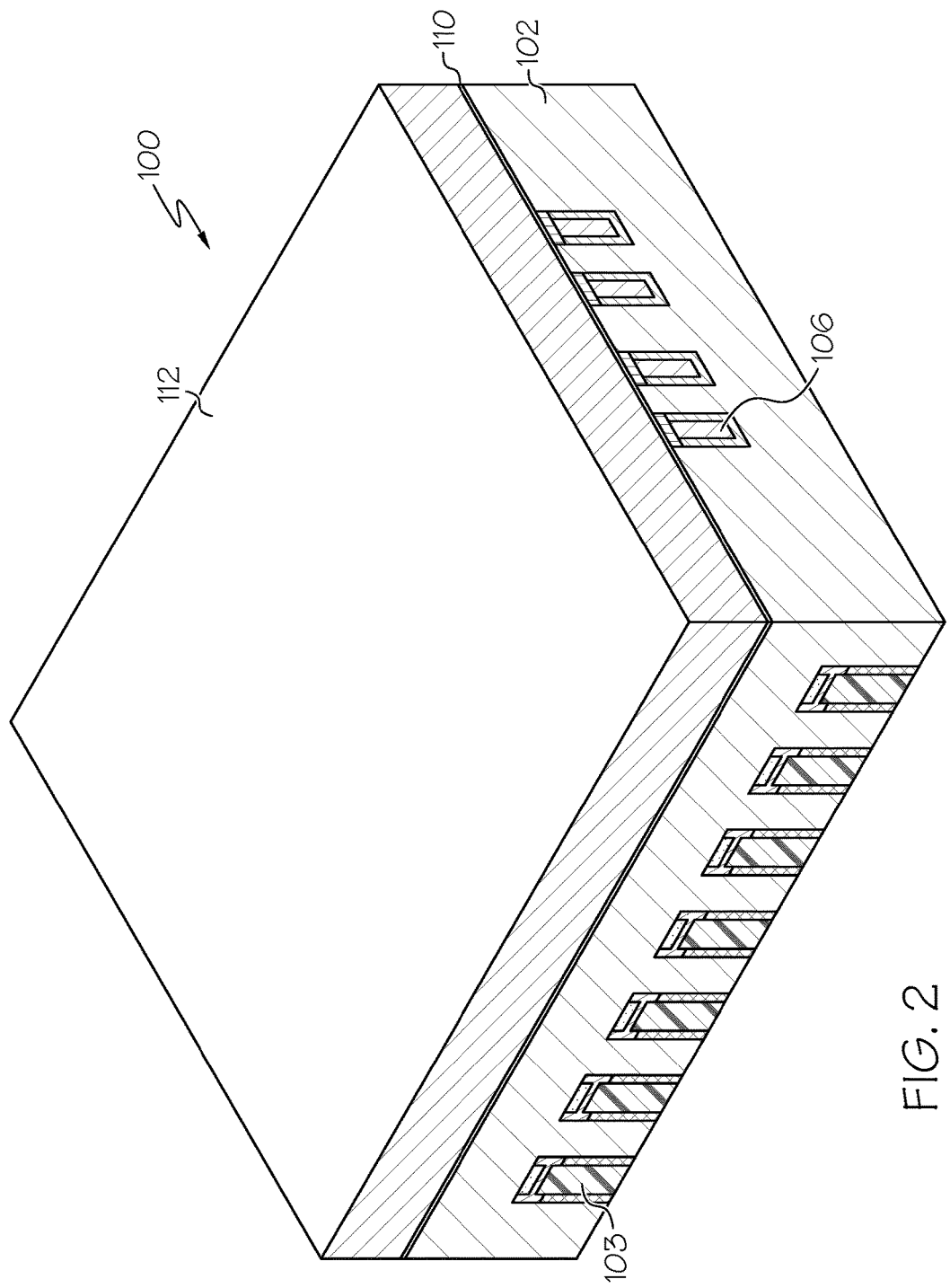

FIG. 2 is a semiconductor structure after a subsequent process step of depositing a sacrificial layer.

Figure 3:
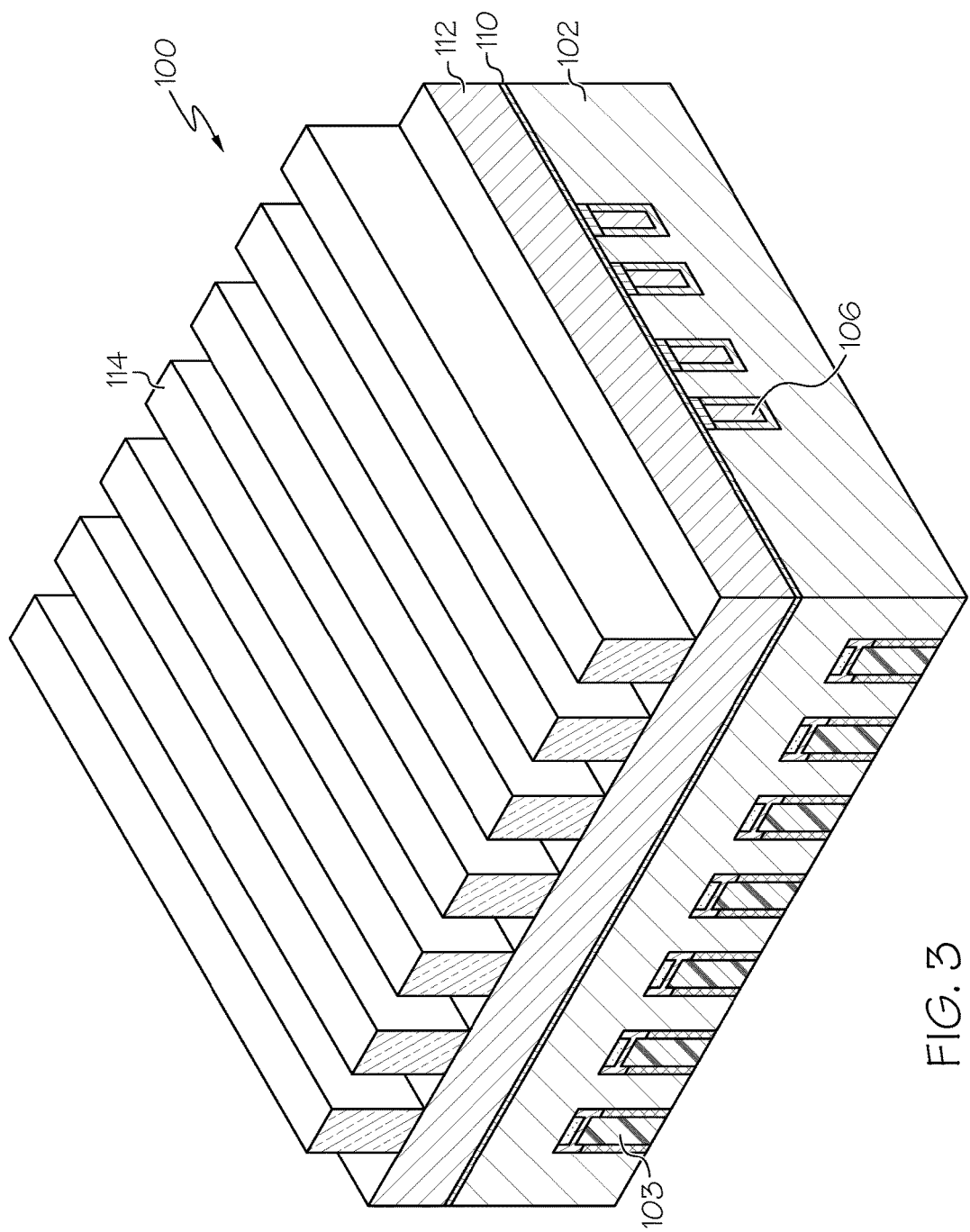

FIG. 3 is a semiconductor structure after subsequent process steps of depositing a resist layer and patterning the resist layer.

Figure 4:
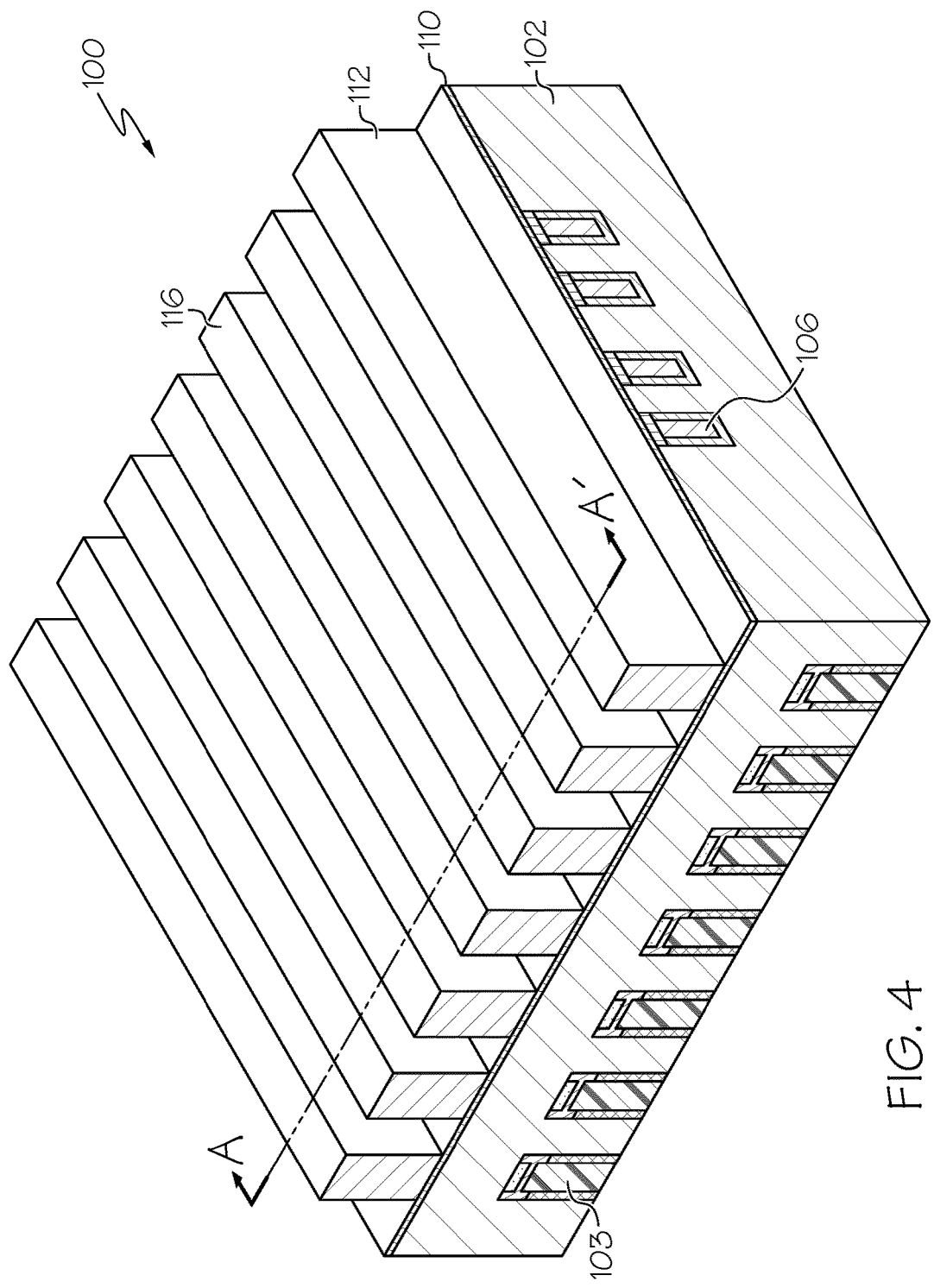

FIG. 4 is a semiconductor structure after subsequent process steps of patterning the sacrificial layer and removing the resist layer.

Figure 5:
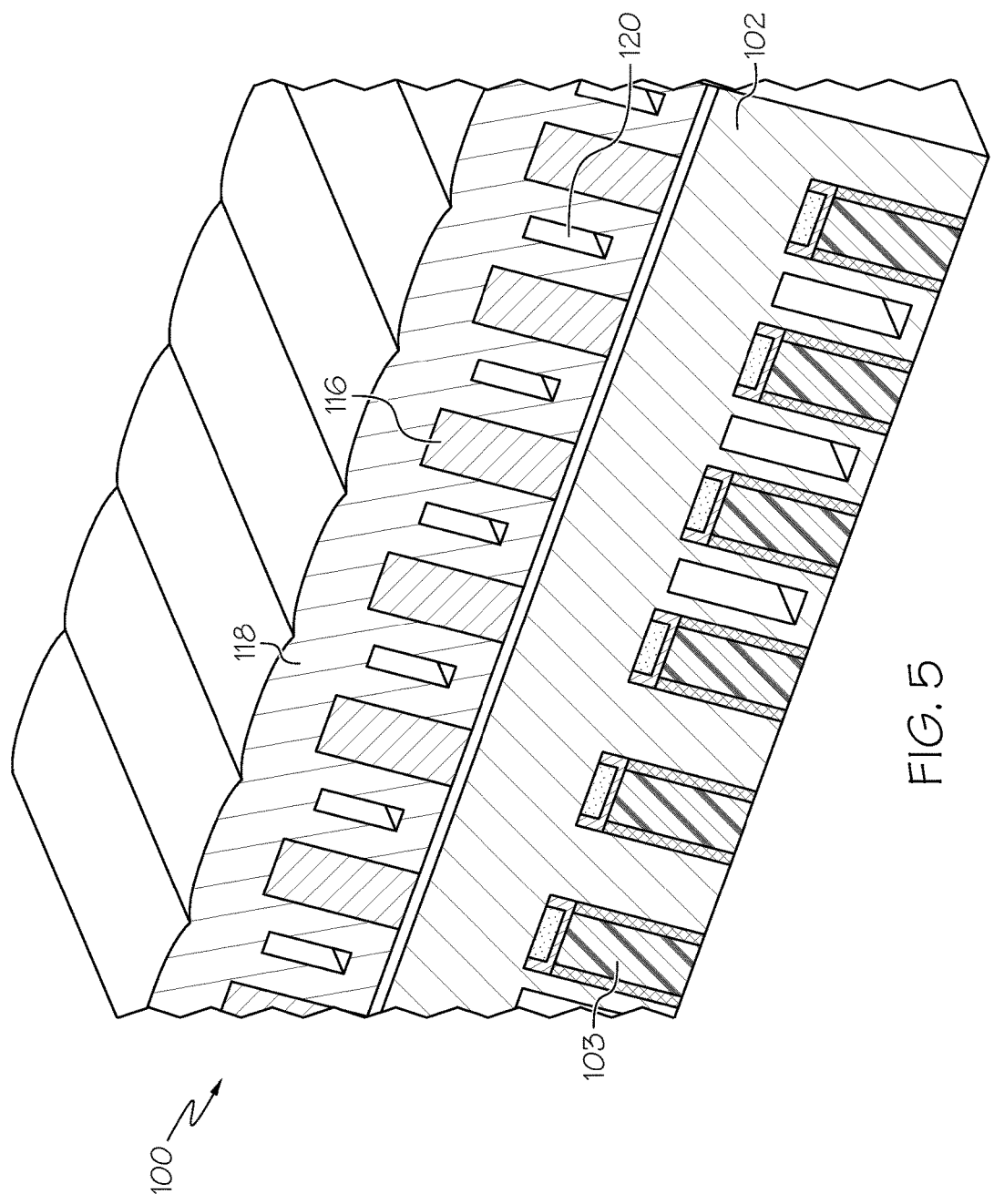

FIG. 5 is a side view of a semiconductor structure after a subsequent process step of depositing a dielectric layer over the sacrificial Mx+1 lines.

Figure 6:
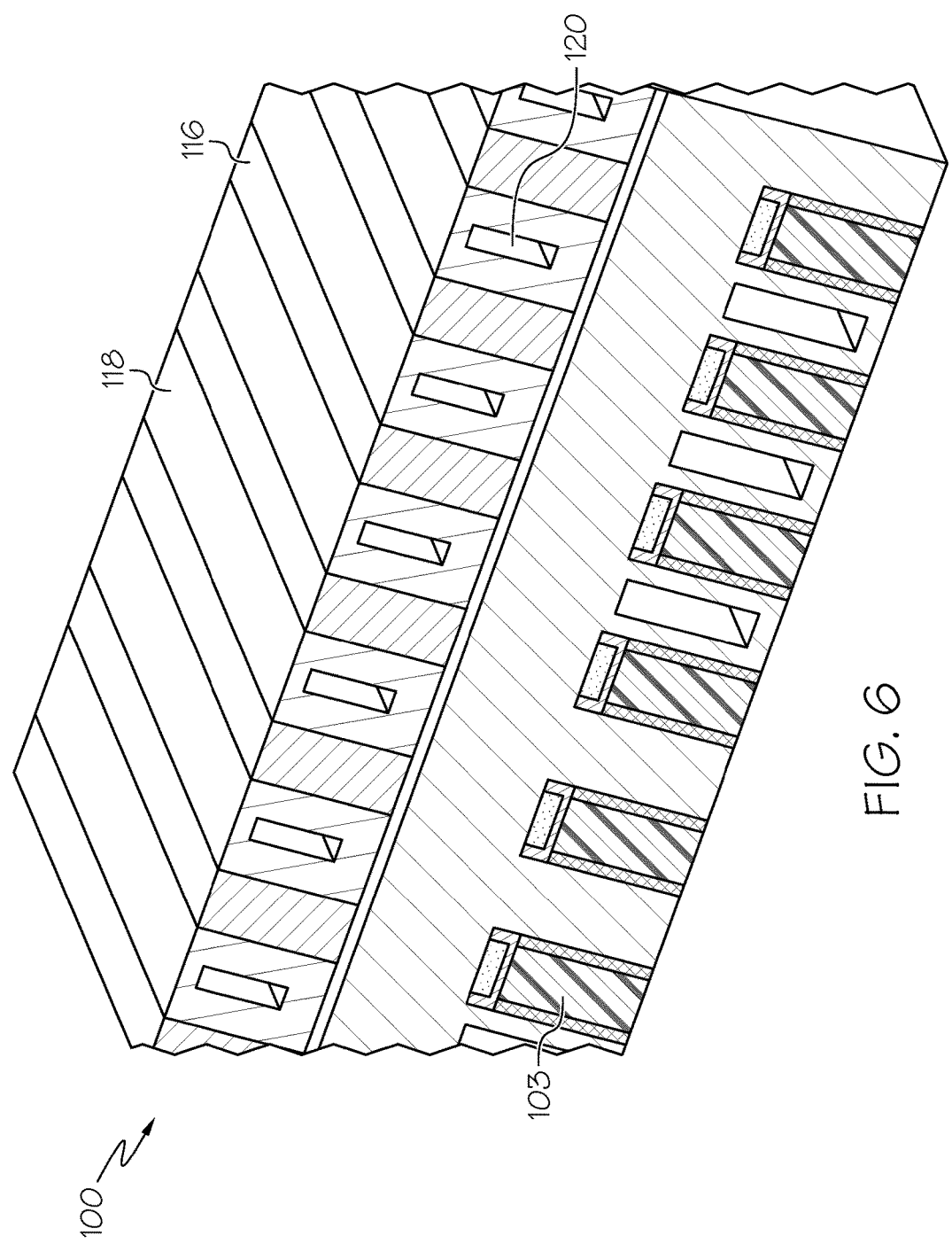

FIG. 6 is a side view of a semiconductor structure after a subsequent process step of planarizing the dielectric layer.

Figure 7:
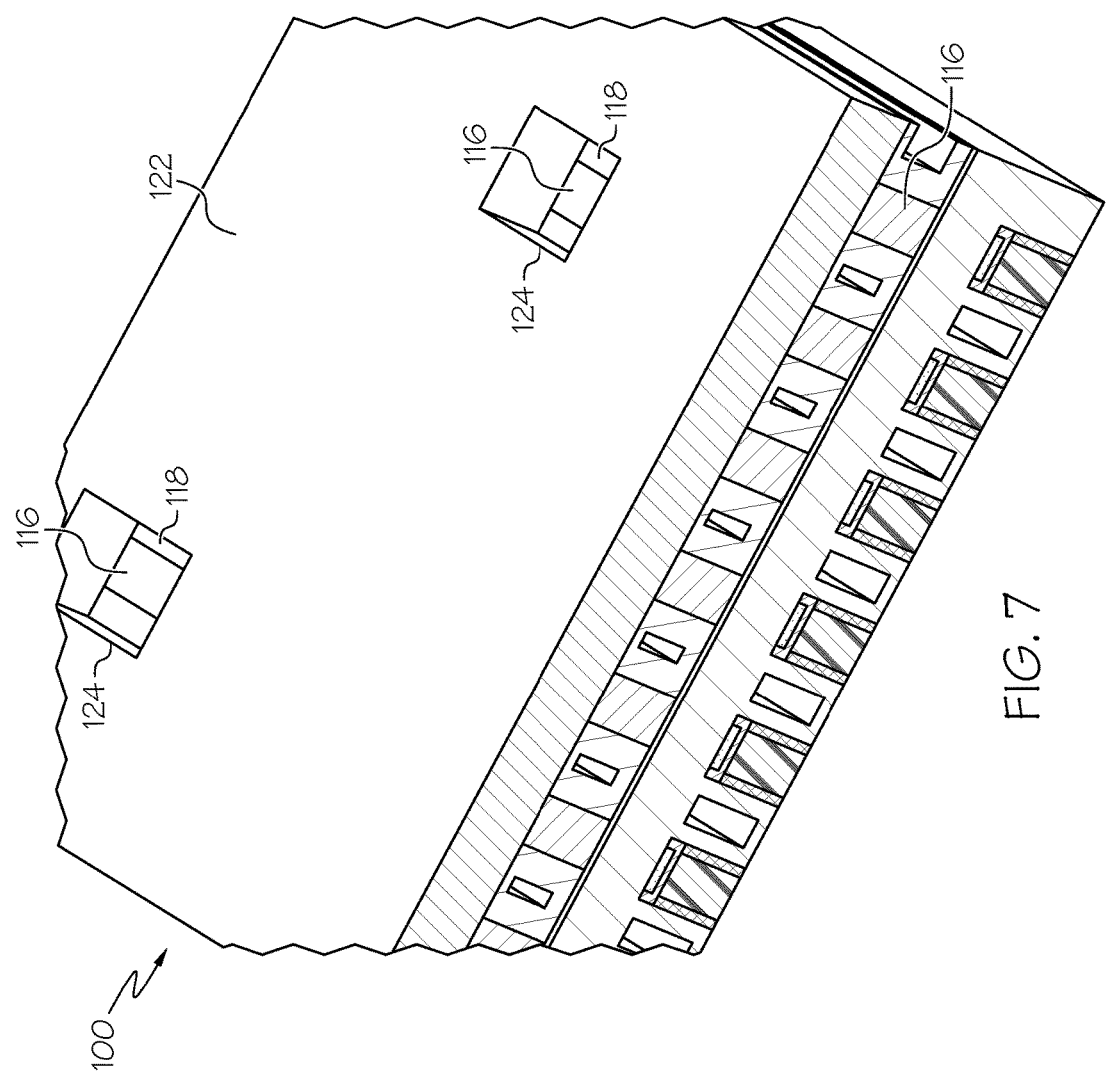

FIG. 7 is a semiconductor structure after subsequent process steps of depositing and patterning a line cut lithography stack.

Figure 8:
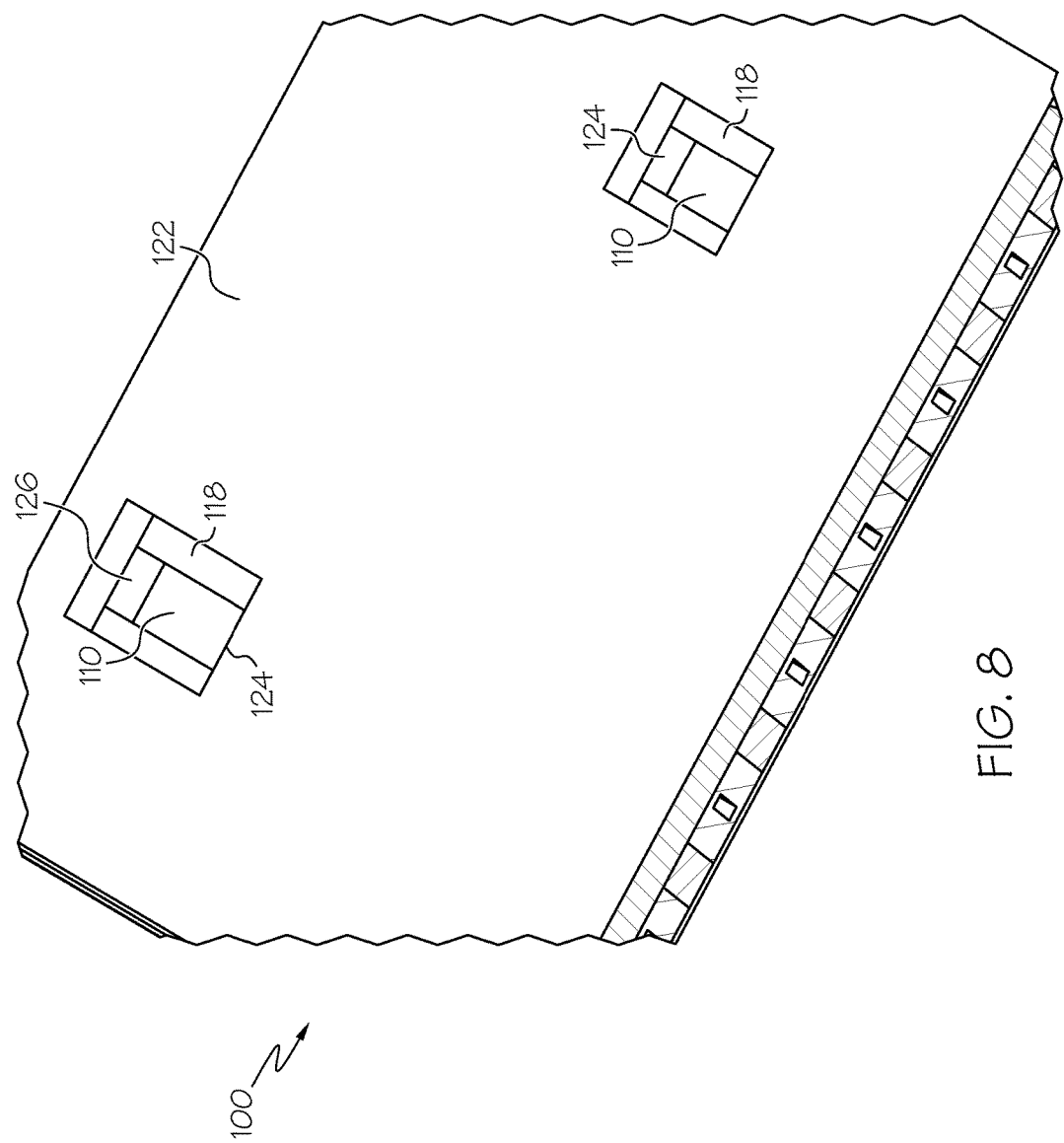

FIG. 8 is a semiconductor structure after a subsequent process step of forming a cut cavity in a sacrificial Mx+1 line.

Figure 9:
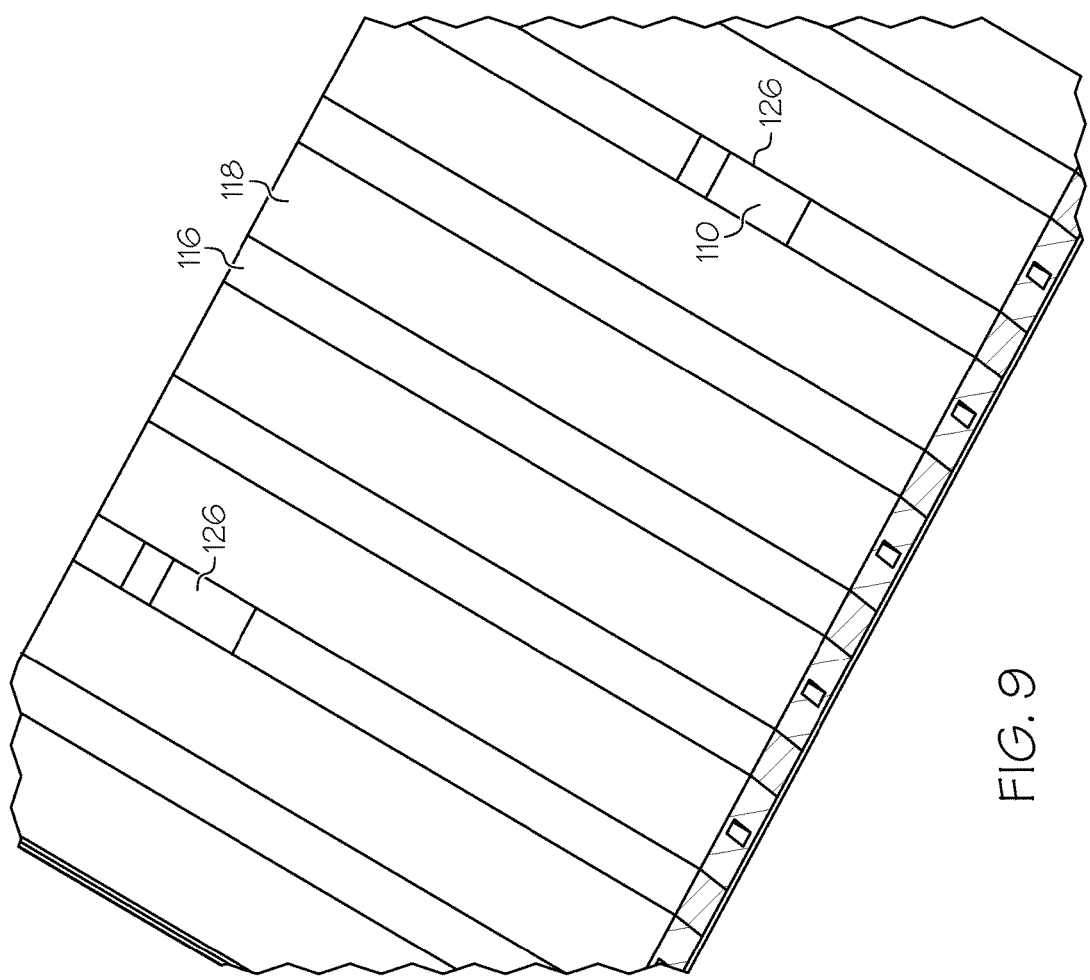

FIG. 9 is a semiconductor structure after a subsequent process step of removing the line cut lithography stack.

Figure 10:
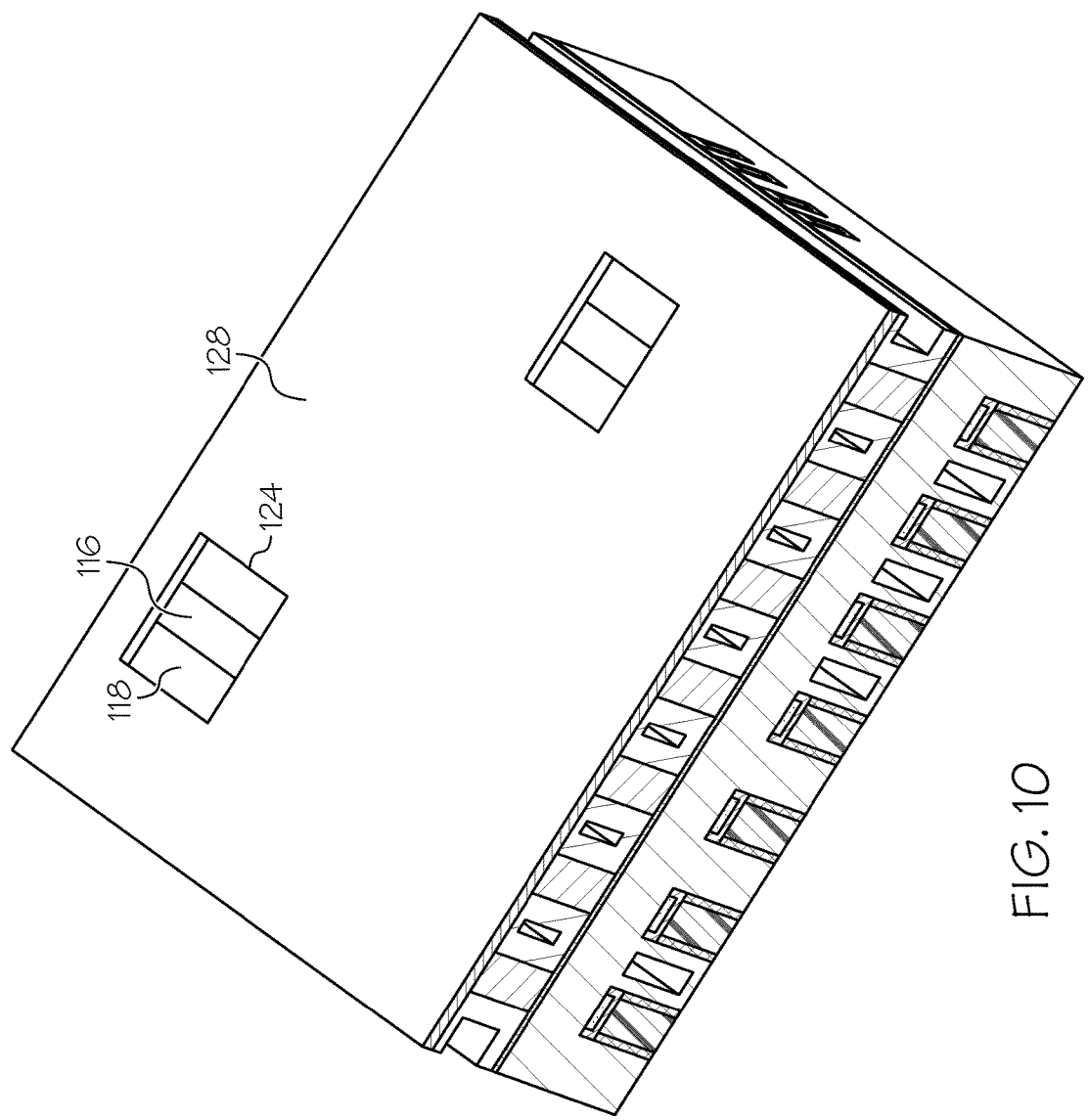

FIG. 10 is a semiconductor structure in accordance with an alternative embodiment of the present invention after a subsequent process step of removing the resist layer.

Figure 11:
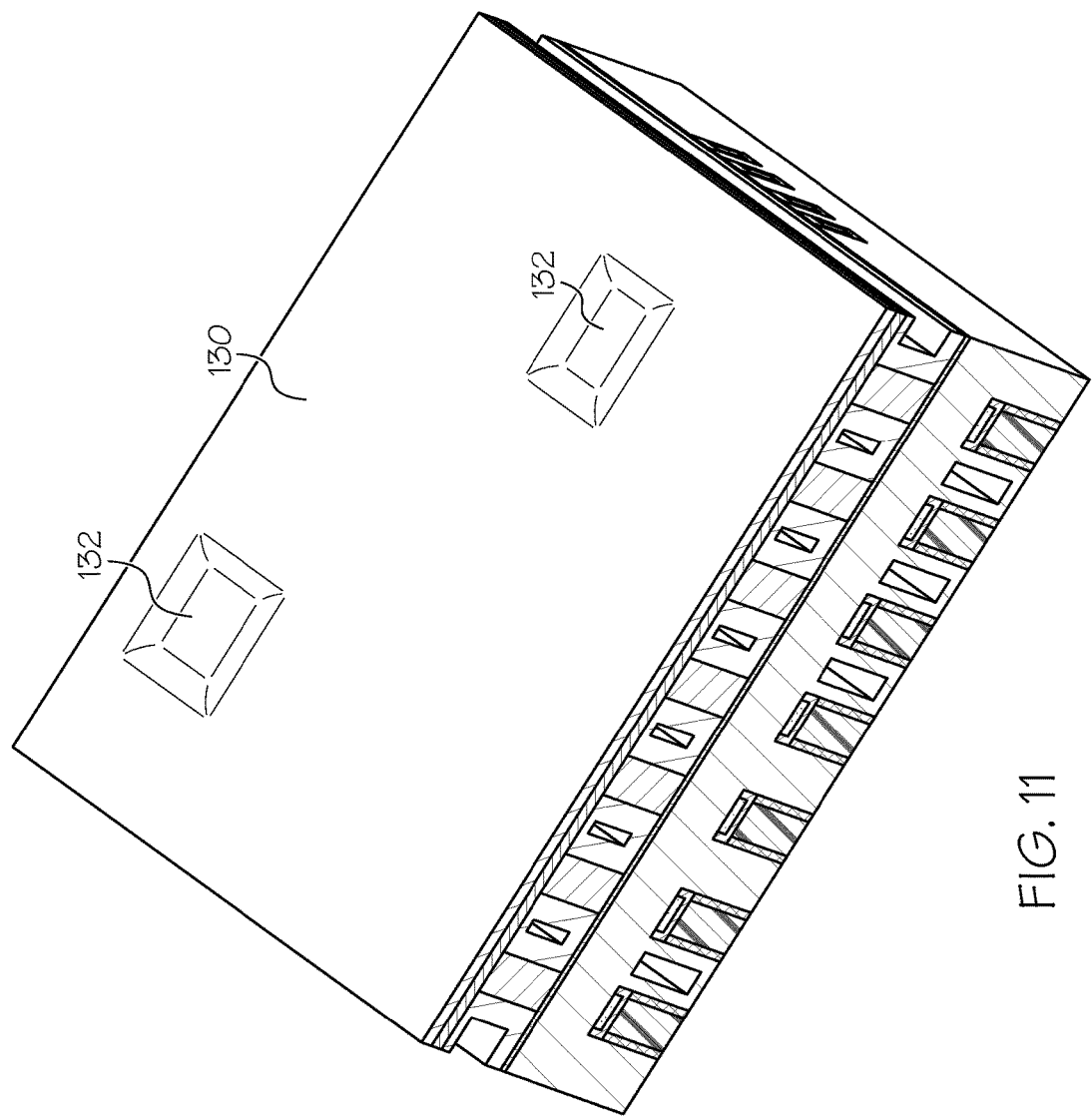

FIG. 11 is a semiconductor structure in accordance with an alternative embodiment of the present invention after a subsequent process step of depositing a conformal spacer layer.

Figure 12:
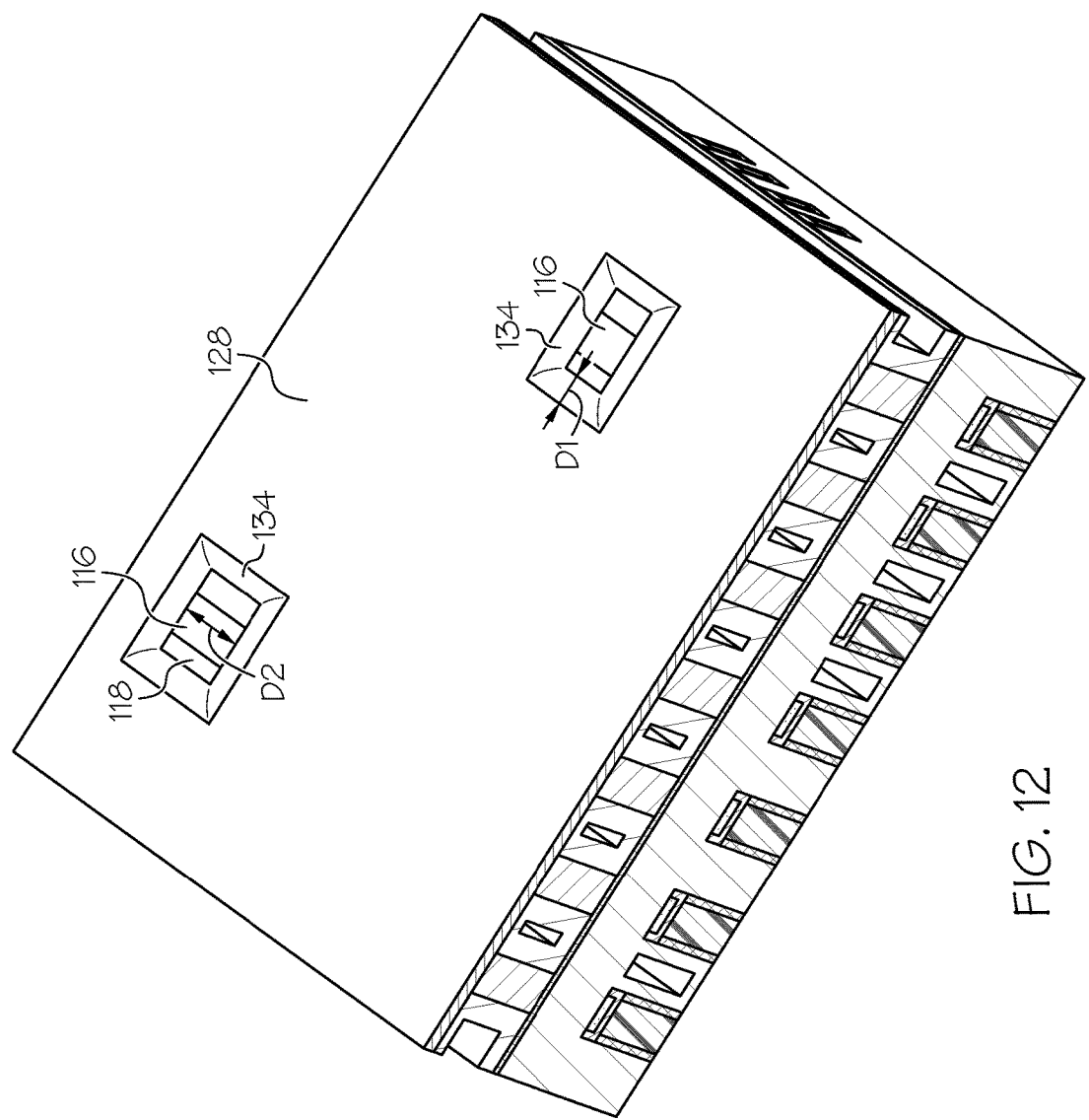

FIG. 12 is a semiconductor structure in accordance with an alternative embodiment of the present invention after a subsequent process step of performing an anisotropic etch to form an aperture spacer.

Figure 13:
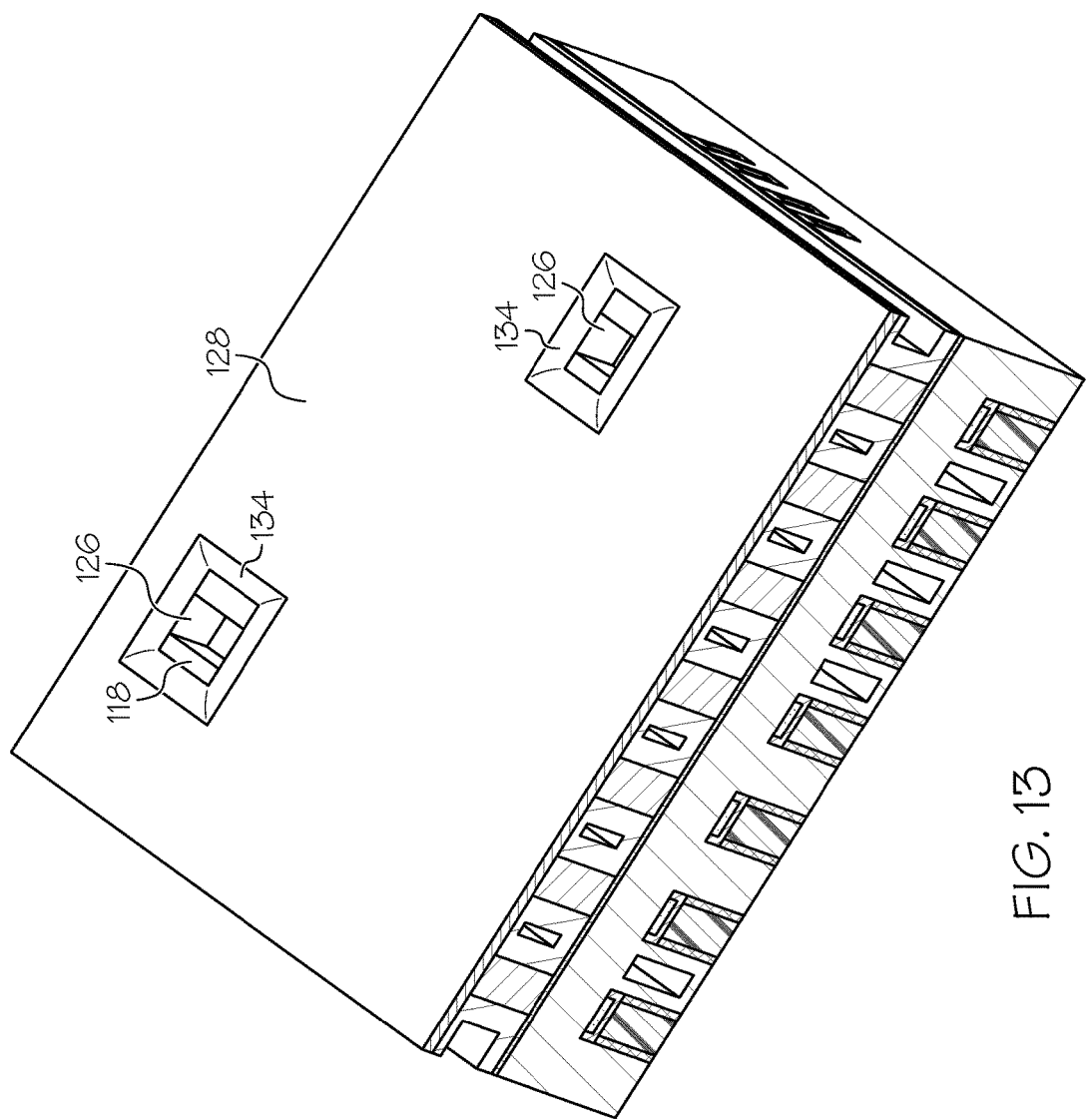

FIG. 13 is a semiconductor structure in accordance with an alternative embodiment of the present invention after a subsequent process step of forming a cut cavity in a sacrificial Mx+1 line.

Figure 14:
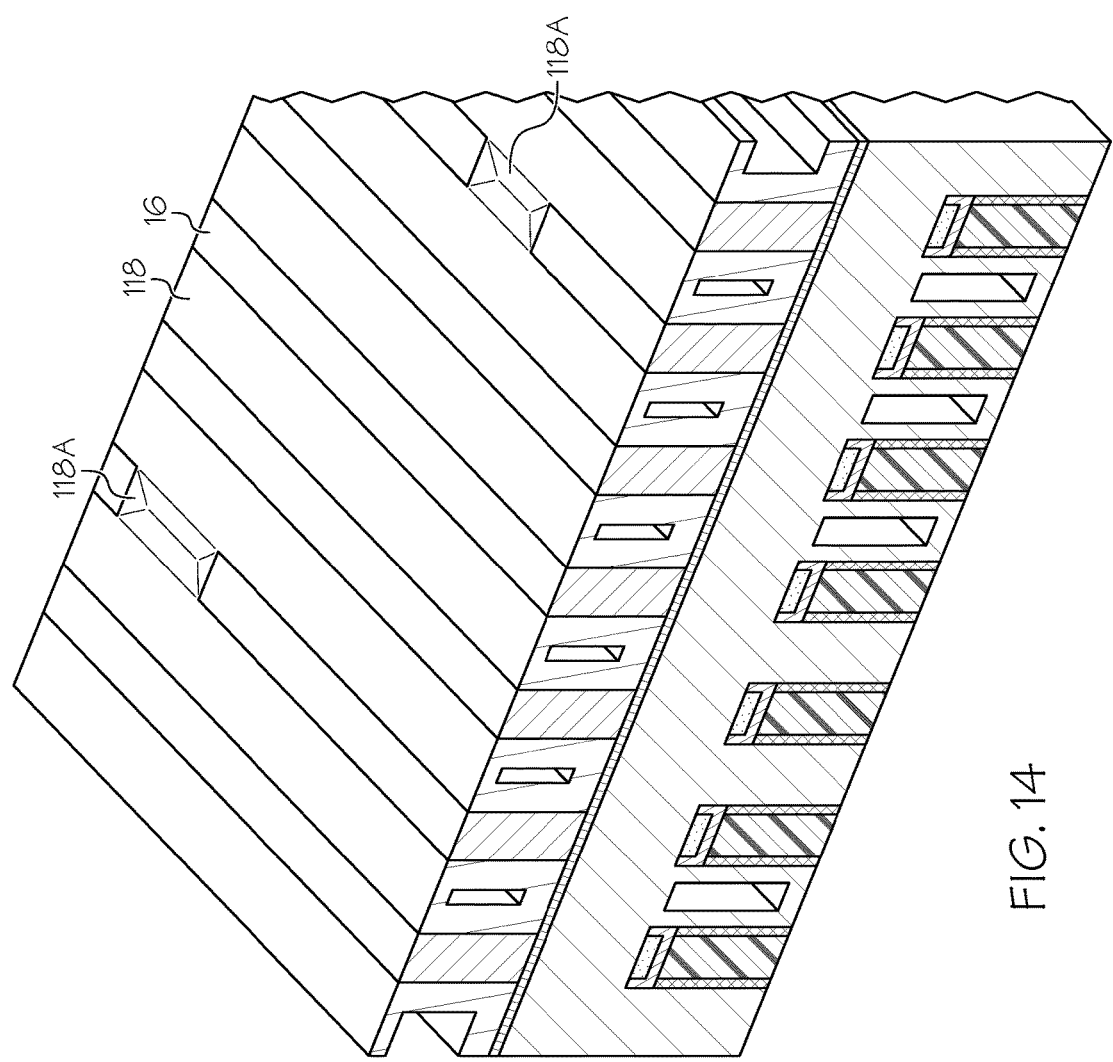

FIG. 14 is a semiconductor structure after a subsequent process step of forming a dielectric region in the cut cavity.

Figure 15:
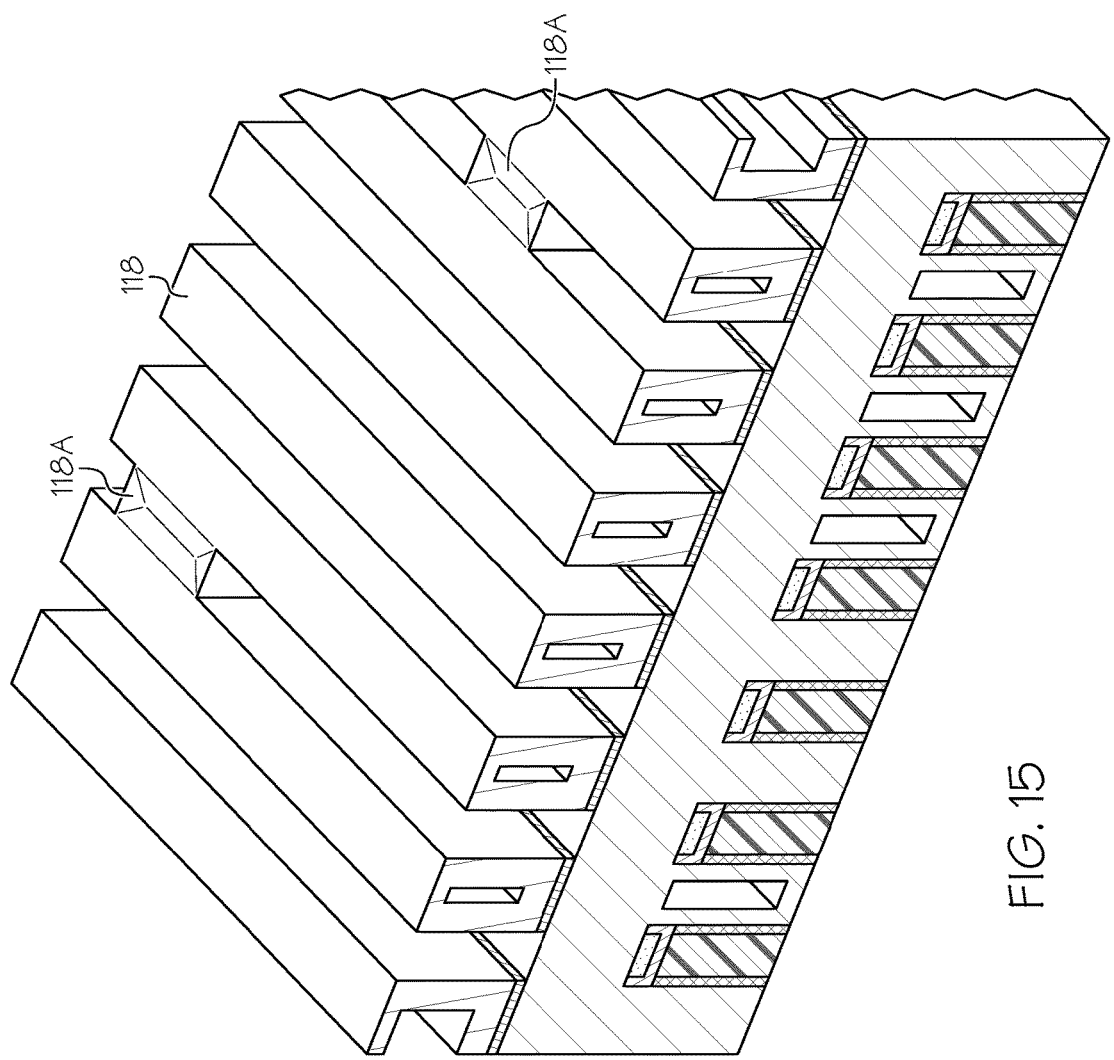

FIG. 15 is a semiconductor structure after a subsequent process step of removing the sacrificial Mx+1 lines.

Figure 16:
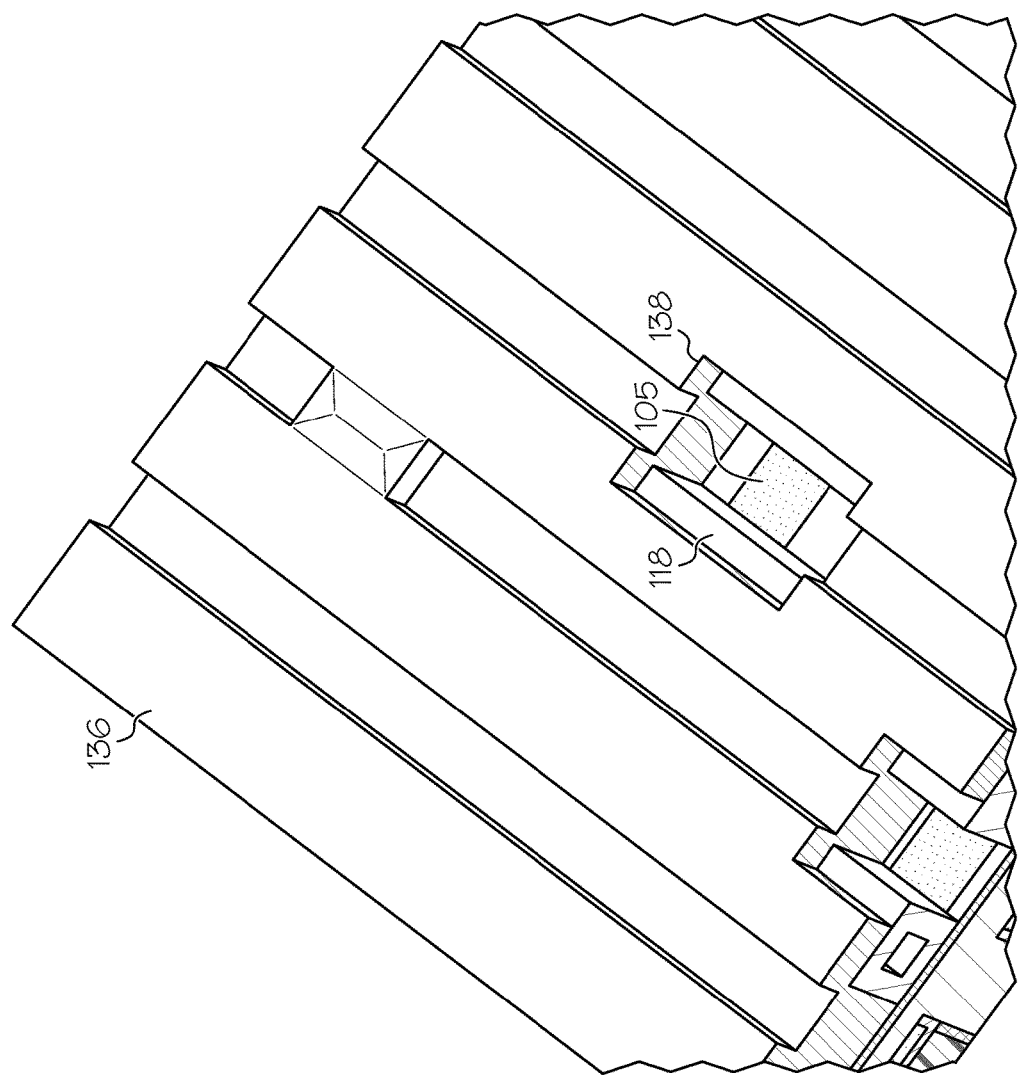

FIG. 16 is a semiconductor structure after subsequent process steps of depositing and patterning a via cut lithography stack.

Figure 17:
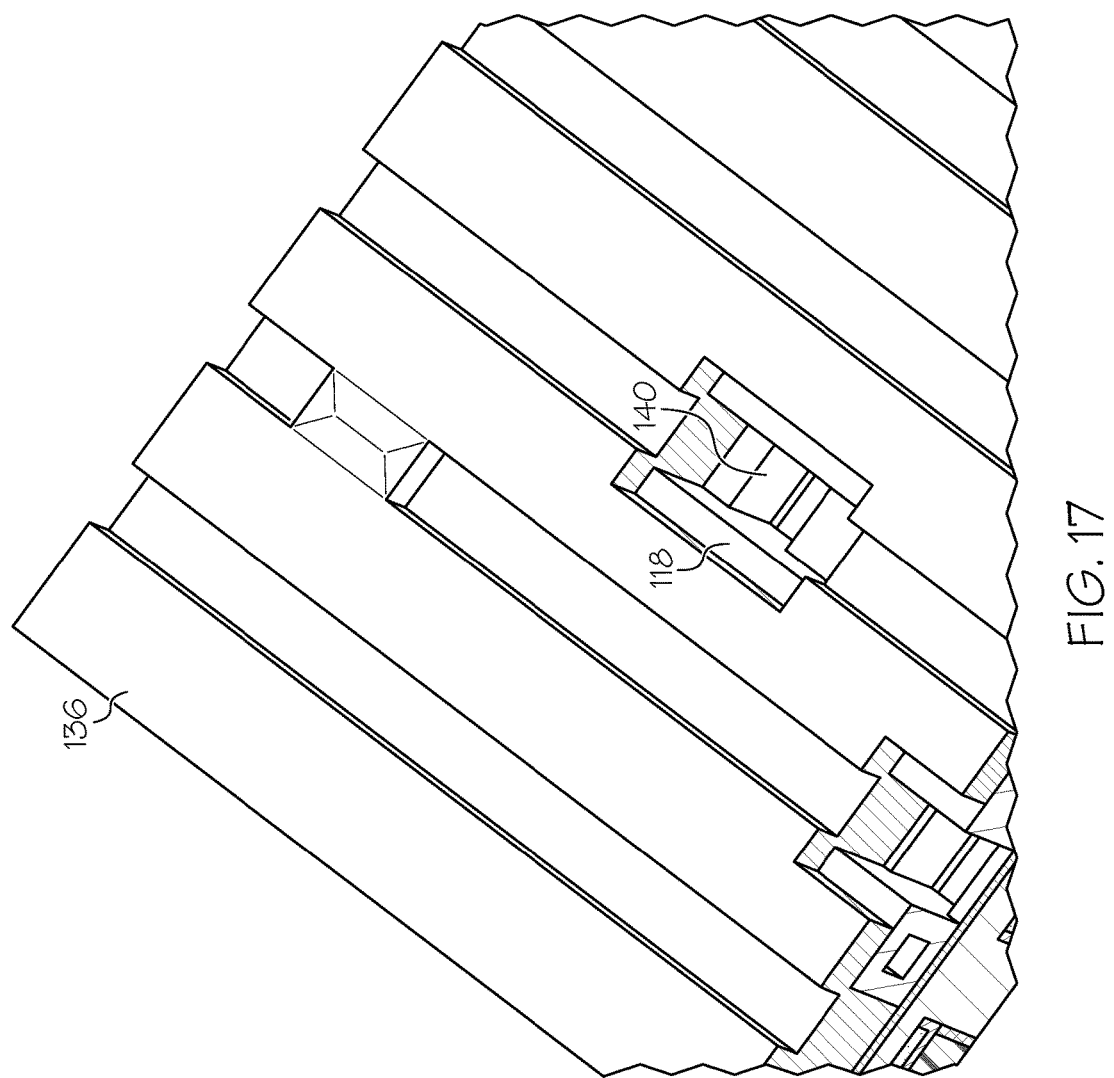

FIG. 17 is a semiconductor structure after a subsequent process step of forming a via cavity that exposes an Mx metal line.

Figure 18:
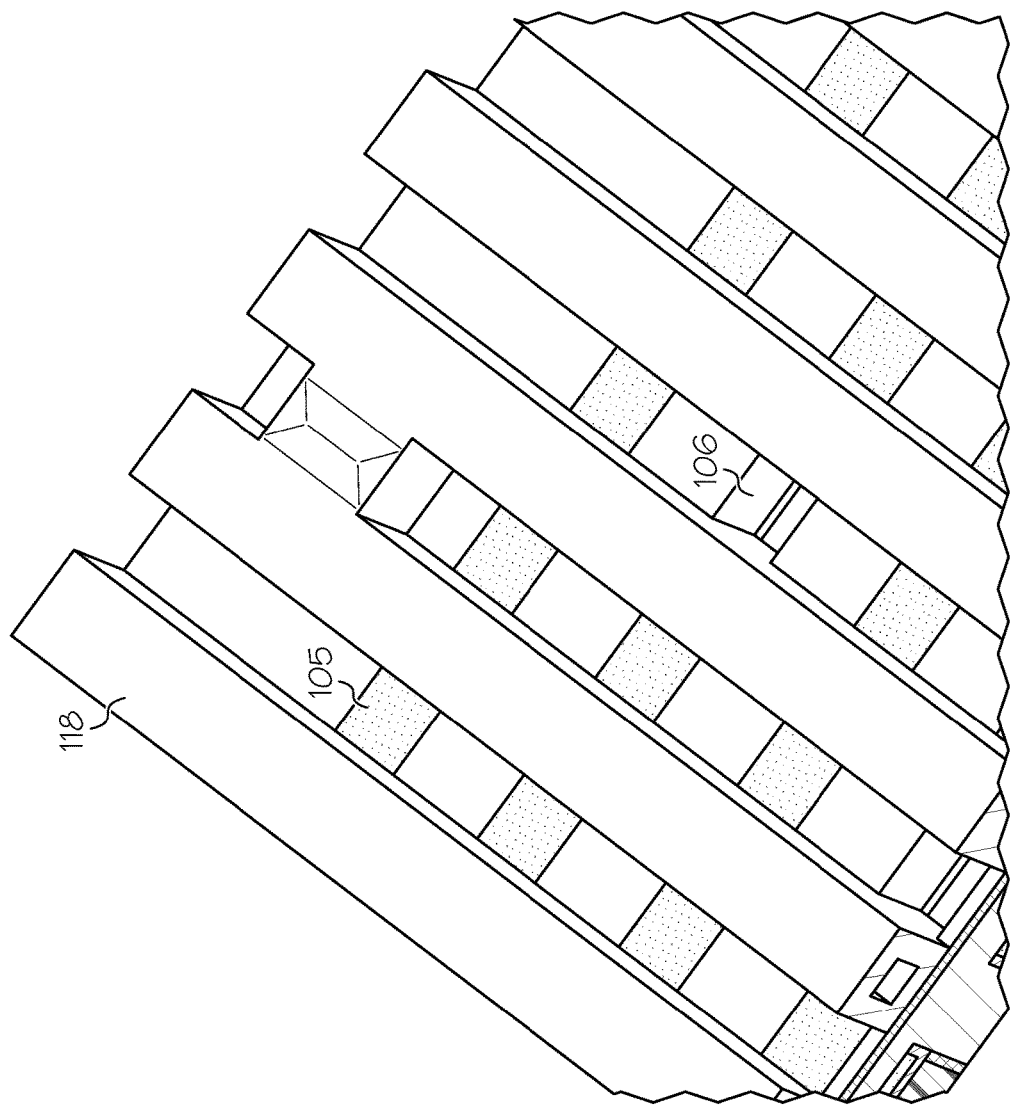

FIG. 18 is a semiconductor structure after a subsequent process step of removing the via cut lithography stack.

Figure 19:
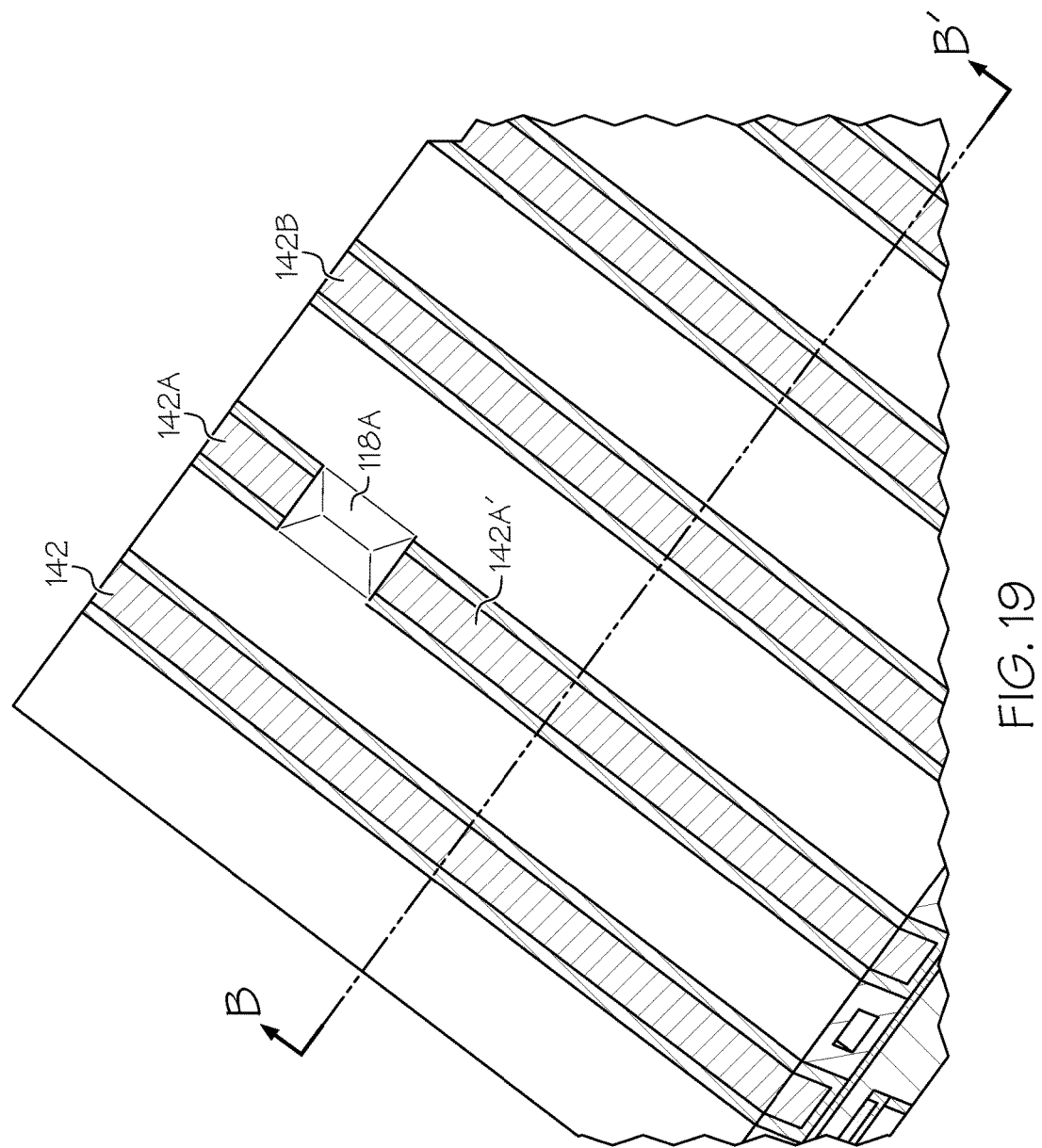

FIG. 19 is a semiconductor structure after a subsequent process step of forming metal Mx+1 lines.

Figure 20:
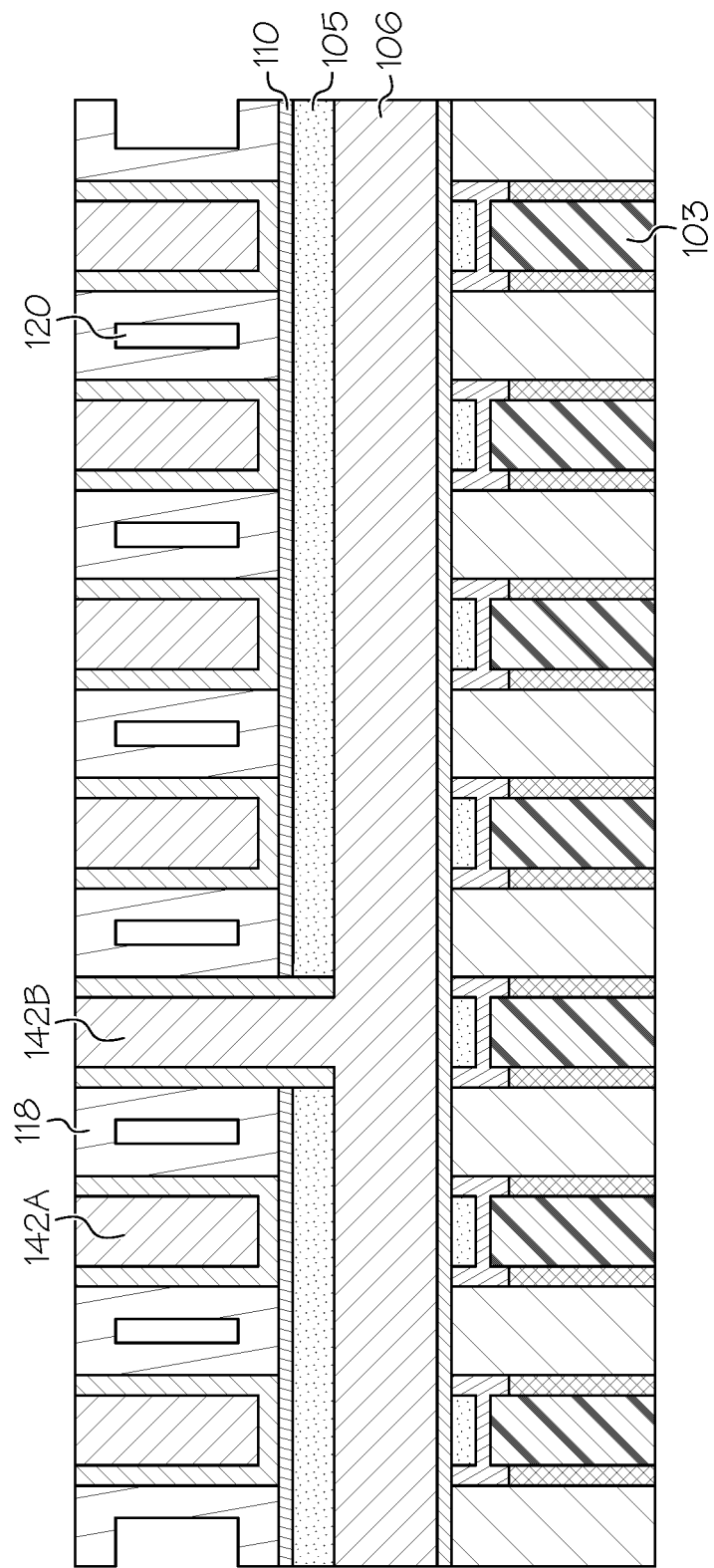

FIG. 20 is the semiconductor structure of FIG. 19 as viewed along line B-B'.

Figure 21:
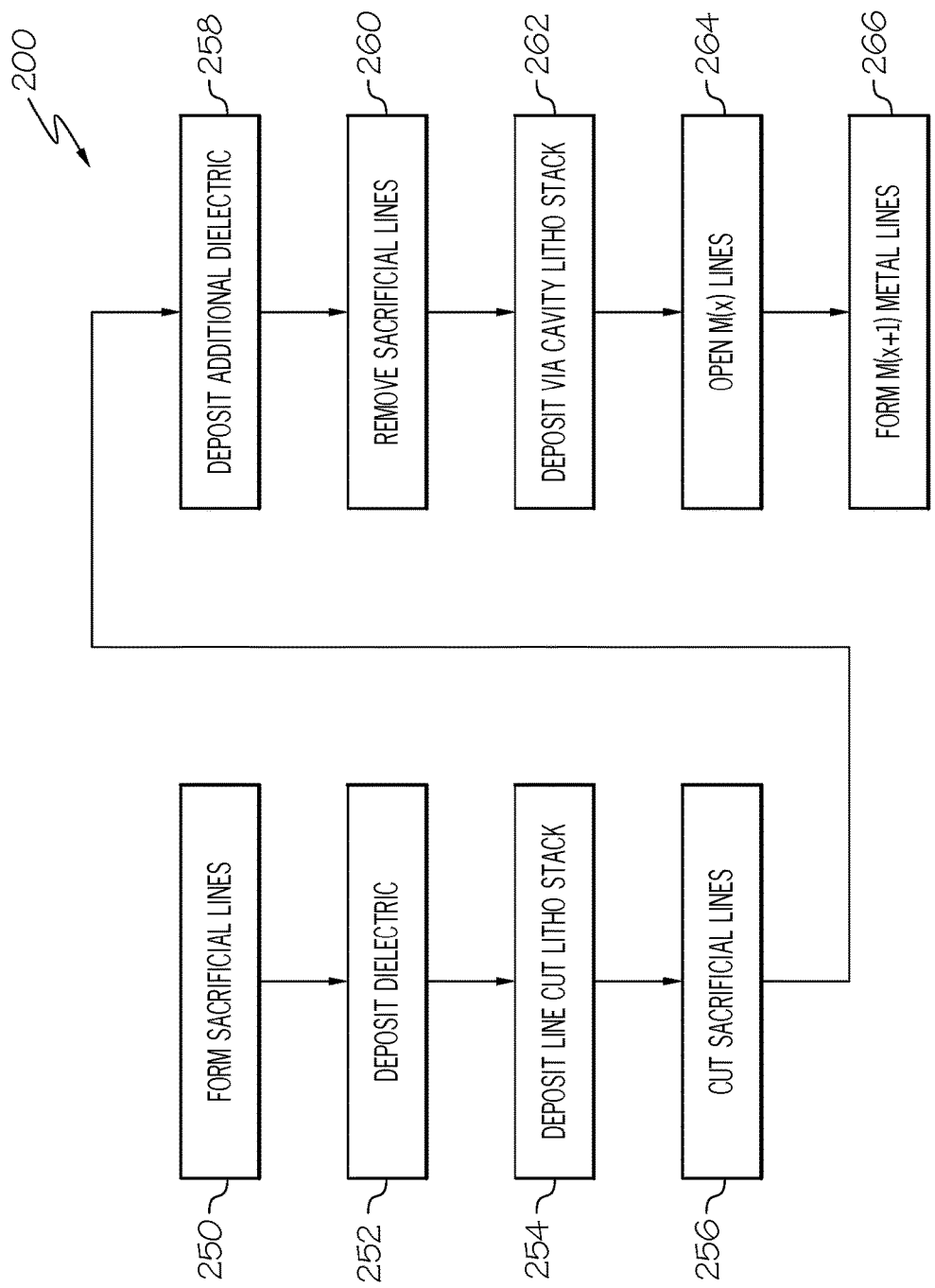

FIG. 21 is a flowchart indicating process steps for embodiments of the present invention.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

FIG. 1 is a semiconductor structure 100 at a starting point for embodiments of the present invention. Semiconductor structure 100 shows a back-end-of-line (BEOL) wiring structure having a plurality of metal lines 106, which are formed in a dielectric layer 102. In embodiments, dielectric layer 102 may be comprised of SiOC (silicon oxycarbide). In embodiments, the metal lines 106 are comprised of copper. In embodiments, each metal line 106 is surrounded on the sides and bottom by a barrier layer 104. This serves to prevent diffusion of the metal. In embodiments, the barrier layer 104 is comprised of tantalum and/or tantalum nitride. A capping layer 105 may be deposited on the tops of the metal lines 106. In embodiments, the capping layer 105 may be comprised of SiN (silicon nitride). The metal lines 106 are referred to as Mx lines, where "x" denotes a particular metallization level. Below metal lines 106 are metal lines 103. Thus, metal lines 103 are referred to as Mx−1 metal lines. The metal lines may be formed using industry-standard techniques, including, but not limited to, barrier deposition, metal seed layer deposition, and a metal plating process, followed by a planarization process. In embodiments, an etch stop layer 110 is deposited over the dielectric layer 102, covering the metal lines 106. In embodiments, the etch stop layer 110 is comprised of aluminum oxide (Al2O3).

FIG. 2 is semiconductor structure 100 after a subsequent process step of depositing a sacrificial layer 112 over the semiconductor structure. The sacrificial layer 112 is deposited on the etch stop layer 110. In embodiments, the sacrificial layer 112 may be comprised of SiN, and may be deposited by plasma enhanced chemical vapor deposition (PECVD). Amorphous silicon can also be used as a sacrificial material.

FIG. 3 is semiconductor structure 100 after subsequent process steps of depositing and patterning a resist layer (lithography stack) 114, thus forming a patterned lithography stack. The patterning may be accomplished using industry-standard lithographic methods, including, but not limited to, self-aligned double patterning (SADP), or self-aligned quad patterning (SAQP).

FIG. 4 is semiconductor structure 100 after subsequent process steps of patterning the sacrificial layer and removing the resist layer. This forms sacrificial "dummy" Mx+1 lines 116 on the semiconductor structure. This may be achieved by anisotropically etching the sacrificial layer 112 of FIG. 3, stopping on etch stop layer 110, as to remove the portion of the sacrificial layer that is not covered by the patterned resist layer in order to form sacrificial "dummy" lines 116, and then removing the resist layer 114. In some embodiments, etch stop layer 110 may also be removed. Note that both Mx and Mx+1 are illustrated as a regular set of unidirectional parallel lines at each level, with Mx+1 perpendicular to Mx.

FIG. 5 is a side view of semiconductor structure 100 after a subsequent process step of depositing a dielectric layer 118 over the sacrificial Mx+1 lines as viewed along line A-A' of FIG. 4. In embodiments, the dielectric layer 118 may be comprised of silicon oxycarbide (SiOC). The dielectric layer may be deposited using a plasma-enhanced chemical vapor deposition (PECVD) process. In embodiments, due to the conformal nature of the dielectric layer 118, air gaps 120 may be formed in between each sacrificial line 116. The air gaps have a dielectric constant of approximately 1, and thus can serve to improve circuit performance in regards to high speed signals that propagate through BEOL layers.

FIG. 6 is a side view of semiconductor structure 100 after a subsequent process step of planarizing the dielectric layer 118 such that it is substantially flush with the sacrificial lines 116. In embodiments, the planarization is performed with a chemical mechanical polish (CMP) process. The air gaps 120 may be preserved during this process (as shown), or in some embodiments, may be partially opened (not shown).

FIG. 7 is semiconductor structure 100 after subsequent process steps of depositing and patterning a line cut lithography stack 122. The line cut lithography stack 122 may include an organic planarization layer (OPL) followed by a layer of photoresist (referred to as "resist"). In embodiments, the OPL can include a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB).

A plurality of voids 124 are patterned in the lithography stack 122. The voids 124 each expose a region of a sacrificial line 116, as well as some of the dielectric region 118. The dielectric layer 118 and the sacrificial lines 116 are comprised of different materials, allowing selective etch techniques to remove the portions of the sacrificial lines 116 that are exposed through the voids 124, without removing the exposed dielectric regions 118. Thus, the tolerances of the position and sizing of each void 124 is relaxed, enabling easier manufacturing and improved product yield.

FIG. 8 is semiconductor structure 100 after a subsequent process step of forming a cut cavity 126 in a sacrificial Mx+1 line. As stated previously, the dielectric layer 118 and the sacrificial lines 116 are comprised of different materials, allowing selective etch techniques to remove the portions of the sacrificial lines 116. Thus, exposed regions of sacrificial lines 116 are removed, exposing the etch stop layer 110 below, and forming a cut cavity 126.

FIG. 9 is semiconductor structure 100 after a subsequent process step of removing the line cut lithography stack (122 in FIG. 7). The lithography stack may be removed using industry-standard techniques, thus revealing the pattern of sacrificial lines 116 with cut cavities 126 at locations where the replacement (metal) lines are to be separated.

FIG. 10 is a semiconductor structure in accordance with an alternative embodiment of the present invention after a subsequent process step of removing the resist layer of line cut lithography stack 122 (see FIG. 7), exposing an underlying organic planarization layer (OPL). Thus FIG. 10 follows from FIG. 7, but provides additional process steps to further control the size of the cut cavities, as will be shown in the following figures. Voids 124 are formed in the OPL 128 to expose regions sacrificial lines 116.

FIG. 11 is a semiconductor structure in accordance with an alternative embodiment of the present invention after a subsequent process step of depositing a conformal spacer layer 130. In embodiments, the conformal spacer layer 130 is comprised of carbon, and may be deposited via an atomic layer deposition process. In embodiments, the conformal spacer layer has a thickness ranging from about 2 nanometers to about 5 nanometers. A recessed portion 132 is formed over the voids 124 in the OPL.

FIG. 12 is a semiconductor structure in accordance with an alternative embodiment of the present invention after a subsequent process step of performing an anisotropic etch to form an aperture spacer 134. In embodiments, the anisotropic etch may include a reactive ion etch (RIE) process. The anisotropic etch removes most of the conformal spacer layer, except for the remaining portion, which is aperture spacer 134. The aperture spacers 134 have a segment thickness D1. In embodiments, D1 ranges from about 2 nanometer to about 8 nanometers. The aperture spacers further restrict the opening prior to removing a portion of the sacrificial lines 116 to have a length D2, thus enabling smaller cut cavities. In embodiments, D2 may range from about 5 nanometers to about 30 nanometers.

FIG. 13 is a semiconductor structure in accordance with an alternative embodiment of the present invention after a subsequent process step of forming a cut cavity in a sacrificial Mx+1 line. As stated previously, the dielectric layer 118 and the sacrificial lines 116 are comprised of different materials, allowing selective etch techniques to remove the portions of the sacrificial lines 116. The carbon spacer may then be selectively etched away.

FIG. 14 is a semiconductor structure after a subsequent process step of forming a dielectric region 118A in the cut cavity. From FIG. 14 forward, the process is similar for both the embodiment shown in FIGS. 1-9, and for the alternative embodiment with additional steps shown in FIGS. 10-13. As shown in FIG. 14, additional dielectric material 118A is deposited in each cut cavity. A planarization process may follow, such that the dielectric regions 118A are substantially planar with sacrificial lines 116 and dielectric regions 118. This can be accomplished by a chemical mechanical polish (CMP) process and/or an anisotropic RIE etch back. Dielectric regions 118A and dielectric regions 118 are preferably comprised of the same material. Hence, in embodiments, dielectric regions 118A may also be comprised of SiOC.

FIG. 15 is a semiconductor structure after a subsequent process step of removing the sacrificial Mx+1 lines. This may be accomplished using a selective etch process, such that dielectric regions 118 and 118A remain intact.

FIG. 16 is a semiconductor structure after subsequent process steps of depositing and patterning a via cut lithography stack 136. The via cut lithography stack 136 may contain an OPL layer, antireflective layer, and a resist layer. Using patterning, voids 138 are formed in the via cut lithography stack 136. The voids are formed over an area where the sacrificial lines 116 have been removed, thus revealing a portion of capping layer 105 of a perpendicularly oriented Mx line disposed in the metallization layer below. Depending on a given design, it is desirable to, at certain locations, form vias that interconnect to neighboring metallization levels. Thus, voids are formed where it is desirable to form a via between an Mx line and an Mx+1 line.

FIG. 17 is a semiconductor structure after a subsequent process step of forming a via cavity that exposes an Mx metal line. The region of capping layer (see 105 of FIG. 16) is removed using a selective etch process. For example, if the dielectric layer 118 is SiOC, and the capping layer 105 is SiN, then a variety of selective etch techniques can be used to selectively remove the capping layer 105. Embodiments of the present invention may use other materials for the dielectric and capping layer, so long as selective etching of the materials to each other is possible.

FIG. 18 is a semiconductor structure after a subsequent process step of removing the via cut lithography stack (136 of FIG. 17). This exposes capping regions 105 where no via is to be formed, while Mx line 106 is exposed in an area where a via is to be formed.

FIG. 19 is a semiconductor structure after a subsequent process step of forming metal Mx+1 lines. In embodiments, this may include an electroplating process. The process may include depositing one or more barrier layers and/or seed layers (not shown). Then, a fill metal (such as copper) is deposited in the location where the sacrificial Mx+1 lines previously occupied, forming metallization lines 142. The dielectric region 118A separates metallization line 142A from metallization line 142A'. Thus, metallization lines 142A and 142A' are precut, as they are formed with the cuts already in place, and so metal cutting is avoided. Metallization line 142B has a via that connects to the Mx level, as will be further described in the next figure.

FIG. 20 is the semiconductor structure of FIG. 19 as viewed along line B-B'. As can be seen, Mx+1 metal line 142B connects to Mx metal line 106. When Mx+1 metal line 142B was formed, the Mx line 106 was exposed, since its capping layer was removed (see 106 in FIG. 18). Hence, the process in accordance with embodiments of the present invention simplifies fabrication by avoiding metal cuts, and also integrates via connectivity into the metallization process.

FIG. 21 is a flowchart 200 indicating process steps for embodiments of the present invention. In process step 250, sacrificial lines are formed. In embodiments, the sacrificial lines are comprised of silicon nitride. In process step 252, a dielectric layer is deposited. In embodiments, the dielectric layer is comprised of SiOC. In process step 254, a line cut lithography stack is deposited (see 122 of FIG. 7). In process step 256, the sacrificial lines are cut (see FIG. 9). In process step 258, additional dielectric is deposited in the cut cavities (see 118A of FIG. 14). In process step 260, the sacrificial lines are removed (see FIG. 15). In embodiments, the etch stop layer (110 in FIG. 1) is also removed. In process step 262, a via cavity lithography stack is deposited (see 136 of FIG. 16). In process step 264, selected M(x) lines are opened in locations where a via between the M(x) and M(x+1) levels is to be formed (see 140 of FIG. 17). In process step 266, M(x+1) metal lines are formed (see 142 of FIG. 19). The processes disclosed herein may then be repeated to make multiple metallization levels. In some embodiments, there may be 10 or more levels. Once the BEOL stack is complete, industry-standard techniques for additional processes such as packaging and test may be used to complete fabrication of the integrated circuit.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor device, comprising:
   a first dielectric layer;
   a plurality of first metal lines disposed within the first dielectric layer, wherein each of the plurality of first metal lines has a first orientation;
   a capping layer disposed on the plurality of first metal lines;
   an etch stop layer disposed above the capping layer and the first dielectric layer;
   a second dielectric layer disposed on the etch stop layer;
   a plurality of second metal lines disposed within the second dielectric layer, wherein each of the plurality of second metal lines has a second orientation;
   a via connecting a first metal line and a second metal line; and
   a plurality of third metal lines disposed within the first dielectric layer, wherein each of the third metal lines has the second orientation and a top of each of the third metal lines is below a bottom of each of the first metal lines.

2. The semiconductor device of claim 1, wherein the second orientation is perpendicular to the first orientation.

3. The semiconductor device of claim 1, wherein a top surface of the capping layer is coplanar with a top surface of the first dielectric layer.

4. The semiconductor device of claim 1, further comprising a dielectric region disposed between two collinear metal lines of the plurality of second metal lines.

5. The semiconductor device of claim 1, further comprising a barrier layer surrounding two sides and a bottom of each first metal line and each second metal line.

6. The semiconductor device of claim 1, further comprising a plurality of air gaps disposed in the second dielectric layer, wherein each air gap is disposed between two adjacent second metal lines.

7. A semiconductor device, comprising:
   a first dielectric layer;
   a plurality of first metal lines disposed within the first dielectric layer, wherein each of the plurality of first metal lines has a first orientation;
   a capping layer disposed on the plurality of first metal lines;
   an etch stop layer disposed above the capping layer and the first dielectric layer;
   a second dielectric layer disposed on the etch stop layer;
   a plurality of second metal lines disposed within the second dielectric layer, wherein each of the plurality of second metal lines has a second orientation perpendicular to the first orientation;
   a dielectric region disposed between two collinear metal lines of the plurality of second metal lines;
   a plurality of air gaps disposed in the second dielectric layer, wherein each air gap is disposed between two adjacent second metal lines;

a via connecting a first metal line and a second metal line; and a plurality of third metal lines disposed within the first dielectric layer, wherein each of the third metal lines has the second orientation and a top of each of the third metal lines is below a bottom of each of the first metal lines.

8. The semiconductor device of claim 7, wherein a top surface of the capping layer is coplanar with a top surface of the first dielectric layer.

9. The semiconductor device of claim 7, further comprising a barrier layer surrounding two sides and a bottom of each first metal line and each second metal line.

10. A semiconductor device, comprising:
a first dielectric layer;
a plurality of first metal lines disposed within the first dielectric layer, wherein each of the plurality of first metal lines has a first orientation;
a capping layer disposed on the plurality of first metal lines;
an etch stop layer disposed above the capping layer and the first dielectric layer;
a second dielectric layer disposed on the etch stop layer;
a plurality of second metal lines disposed within the second dielectric layer, wherein each of the plurality of second metal lines has a second orientation;
a via connecting a first metal line and a second metal line;
a dielectric region disposed between two collinear metal lines of the plurality of second metal lines; and
a plurality of third metal lines disposed within the first dielectric layer, wherein each of the third metal lines has the second orientation and a top of each of the third metal lines is below a bottom of each of the first metal lines.

11. The semiconductor device of claim 10, wherein the second orientation is perpendicular to the first orientation.

12. The semiconductor device of claim 10, wherein a top surface of the capping layer is coplanar with a top surface of the first dielectric layer.

13. The semiconductor device of claim 10, further comprising a plurality of air gaps disposed in the second dielectric layer, wherein each air gap is disposed between two adjacent second metal lines.

14. The semiconductor device of claim 10, wherein the second metal lines are comprised of a plurality of Mx+1 line cavities filled with a metal.

* * * * *